United States Patent
Cho et al.

(10) Patent No.: US 7,351,618 B2
(45) Date of Patent: Apr. 1, 2008

(54) METHOD OF MANUFACTURING THIN FILM TRANSISTOR SUBSTRATE

(75) Inventors: Eou-sik Cho, Seoul (KR); Jang-soo Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 11/444,184

(22) Filed: May 31, 2006

(65) Prior Publication Data

US 2007/0020825 A1  Jan. 25, 2007

(30) Foreign Application Priority Data

Jul. 22, 2005  (KR) .................. 10-2005-0066908

(51) Int. Cl.
*H01L 21/00* (2006.01)
*H01L 21/84* (2006.01)

(52) U.S. Cl. ............... 438/149; 257/149; 257/E29.273; 438/734

(58) Field of Classification Search ................ 438/149, 438/155
See application file for complete search history.

(56) References Cited

U.S. PATENT DOCUMENTS 6,586,286 B2 *  7/2003  Park et al. .................. 438/155
7,256,842 B2 *  8/2007  Hwang et al. ................ 349/38

* cited by examiner

*Primary Examiner*—Kimberly D. Nguyen
*Assistant Examiner*—Kimberly Trice
(74) *Attorney, Agent, or Firm*—F. Chau & Assoc., LLC

(57) ABSTRACT

A method of manufacturing a thin film transistor (TFT) substrate to minimize a rugged surface of an organic layer overlapping with a storage electrode is provided. The method includes forming a passivation layer on a substrate having a storage electrode and an organic layer covering the passivation layer, forming a concave portion by partially removing a portion of the organic layer that overlaps with the storage electrode, planarizing a rugged pattern located on the bottom of the concave portion, and forming an opening extending to a surface of the passivation layer by removing the planarized organic layer from the concave portion.

26 Claims, 8 Drawing Sheets

METHOD OF MANUFACTURING THIN FILM TRANSISTOR SUBSTRATE

CROSS-REFERENCE TO RELATED APPLICATION

This application claims priority from Korean Patent Application No. 10-2005-0066908 filed on Jul. 22, 2005, the disclosure of which is incorporated herein by reference in its entirety.

BACKGROUND OF THE INVENTION

1. Technical Field

The present disclosure relates to a method of manufacturing a thin film transistor (TFT) substrate, and more particularly, to a method of manufacturing a TFT substrate that reduces a rugged surface of an organic layer overlapping with a storage electrode.

2. Discussion of the Related Art

In a liquid crystal display (LCD) apparatus, a plurality of pixel electrodes perform operations to display an image on a display area comprised of a set of unit pixels. The plurality of pixel electrodes are formed at a plurality of unit pixels, respectively. The pixel electrodes are driven by a signal applied thereto through wire. The wire includes a gate line and a data line which cross each other to define a unit pixel area. A scan signal is applied to the gate line to control a signal applied to a pixel electrode through the data line.

Each pixel includes a liquid crystal capacitor which changes the light transmission characteristics of a liquid crystal according to a voltage applied thereto, thereby adjusting the amount of transmitted light. The voltage applied to the liquid crystal capacitor should be maintained during a frame, but it is difficult to maintain a constant voltage only with the liquid crystal capacitor. To maintain each pixel's ability to sustain the voltage, a storage capacitor is connected to the liquid crystal capacitor in parallel in each pixel.

When a data wire and a semiconductor layer in a TFT substrate are patterned using a single mask, the semiconductor layer, except for a channel portion, substantially underlies and overlaps with the data wire. Accordingly, the semiconductor layer exists under a data electric conductor forming a storage capacitor. The semiconductor layer included in the storage capacitor, like a MOS capacitor, causes the change in capacitance of the storage capacitor according to a voltage applied to the storage capacitor. The change in capacitance results in flickering on a display unit of an LCD apparatus. To prevent the change in capacitance, the semiconductor layer overlapping with the storage electrode is etched and removed.

After a passivation layer and an organic layer are deposited, an opening is formed in the organic layer. A pixel electrode is ultimately formed in the opening, whereby the pixel electrode overlaps a storage electrode to form a storage capacitor. Upon formation of the opening, a portion of the organic layer overlapping with the storage electrode is left behind using a slit mask. At this time, the organic layer may have a rugged surface. As a result of the rugged surface, the passivation layer and a gate insulating layer under the opening are etched during subsequent processing, resulting in exposure of the storage electrode and a possible short-circuit of a pixel electrode. In addition, the rugged surface causes a difference of capacitance of the storage capacitor according to a position on a storage capacitor, resulting in flickering in the LCD apparatus.

SUMMARY OF THE INVENTION

Embodiments of the present invention provide a method of manufacturing a thin film transistor substrate to remove a rugged surface of an organic layer overlapping a storage electrode.

According to an embodiment of the present invention, a method of manufacturing a thin film transistor substrate includes forming a passivation layer on a substrate having a storage electrode and an organic layer covering the passivation layer; forming a concave portion by partially removing a portion of the organic layer that overlaps with the storage electrode; planarizing a rugged pattern located on the bottom surface of the concave portion; and forming an opening extending to a surface of the passivation layer by removing the planarized organic layer on the surface of the passivation layer from the concave portion.

BRIEF DESCRIPTION OF THE DRAWINGS

Exemplary embodiments of the invention can be understood in more detail from the following descriptions taken in conjunction with the accompanying drawings in which:

FIGS. 4B through 9 are cross-sectional views showing manufacturing stages according to an embodiment of the present invention, taken along the line B-B' shown in FIG. 4A;

DETAILED DESCRIPTION OF THE EXEMPLARY EMBODIMENTS

Exemplary embodiments of the present invention will be described below in more detail with reference to the accompanying drawings. The present invention may, however, be embodied in many different forms and should not be construed as being limited to the embodiments set forth herein.

The structure of a unit pixel of a thin film transistor (TFT) substrate according to an embodiment of the present invention will be described with reference to FIGS. 1A and 1B.

Figure 1A:
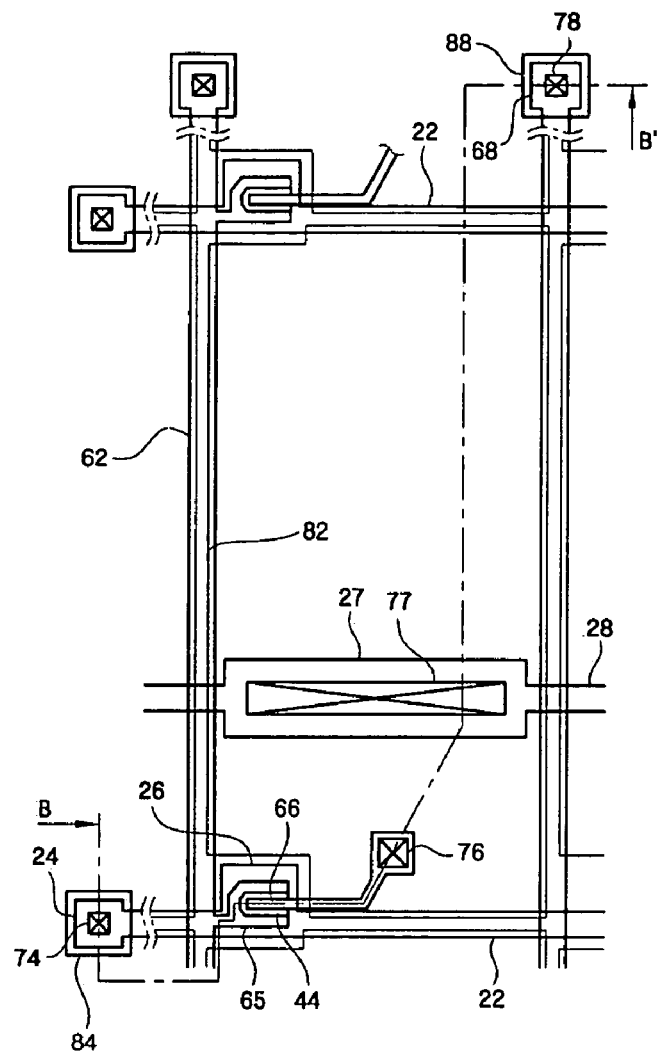
FIG. 1A is a layout diagram of a thin film transistor (TFT) substrate manufactured using a method of manufacturing a TFT substrate according to an embodiment of the present invention.
Figure 1B:
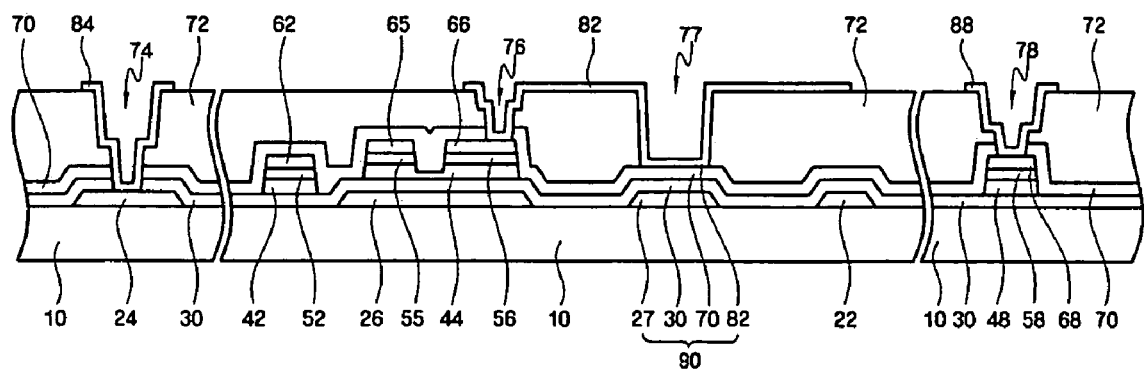
FIG. 1B is a cross-section of the TFT substrate, taken along the line B-B' shown in FIG. 1A.

FIG. 1A is a layout diagram of a thin film transistor (TFT) substrate manufactured using a method of manufacturing a TFT substrate according to an embodiment of the present invention, and FIG. 1B is a cross-section of the TFT substrate, taken along the line B-B' shown in FIG. 1A.

First, a plurality of gate wires, which transmit gate signals, are formed on an insulating substrate 10. The gate wires include a gate line 22 extending in a horizontal direction, a gate pad 24 connected to an end of the gate line 22 to receive a gate signal from, for example, an external source, such as a gate driver, and to transmit the received gate signal to the gate line 22, and a gate electrode 26 of a TFT formed as a protrusion and connected to the gate line 22. A storage electrode 27 and a storage electrode line 28 are formed in parallel with the gate line 22. The storage electrode line 28 extends in the horizontal direction to cross a pixel area and is connected to the storage electrode 27. The width of the storage electrode 27 is wider than that of the storage electrode line 28. When the storage electrode 27 is wider than the storage electrode line 28, an overlapping area between the storage electrode 27 and a pixel electrode 82 is wide, thereby increasing a storage capacity. The storage electrode 27 overlaps with the pixel electrode 82, thereby forming a storage capacitor 90, which increases the charge storage ability of each pixel. In alternative embodiments, the shapes and arrangements of the storage electrode 27 and the storage electrode line 28 may be changed.

The storage capacitor 90 is connected to a liquid crystal capacitor (not shown) in parallel to maintain a voltage applied to the liquid crystal capacitor at a sustained voltage during a single frame. The storage capacitor 90 includes the storage electrode 27 and the portions of a gate insulating layer 30, a passivation layer 70, and the pixel electrode 82 which overlap the storage electrode 27.

According to an embodiment of the present invention, the storage electrode 27 and the gate insulating layer 30 comprise an inorganic material such as silicon nitride ($SiN_x$).

The passivation layer 70 comprises, for example, an inorganic insulator such as silicon nitride ($SiN_x$) or a low dielectric insulating material such as a-Si:C:O and a-Si:O:F formed by plasma enhanced chemical vapor deposition (PECVD), and may have a thickness of approximately 0.2 μm.

A pixel electrode 82 as the other electrode of the storage capacitor 90 is formed on the passivation layer 70 and is connected to the drain electrode 66 so that the storage capacitor 90 connected in parallel to a liquid crystal capacitor (not shown). The pixel electrode 82 is preferably comprises ITO or IZO.

The gate line 22, gate pad 24, gate electrode 26, storage electrode 27, and storage electrode line 28 may be formed of, for example, a single layer comprising a metal, such as Cr, Al, Mo or MoW, double layers of Al alloy (AlNd) and Cr, or double or triple layers of AlNd and W.

The gate insulating layer 30 comprising, for example, silicon nitride (SiNx), is formed on the substrate 10 and the gate line 22, gate pad 24, gate electrode 26, storage electrode 27, and storage electrode line 28.

Semiconductor layers 42, 44, and 48, comprising a semiconductor such as, for example, a hydrogenated amorphous silicon or polysilicon, are formed on the gate insulating layer 30. Ohmic contact layers 52, 55, 56, and 58, comprising a material, such as, for example, n+ hydrogenated amorphous silicon doped with n-type impurities such as silicide at a high concentration, are formed on the semiconductor layers 42, 44, and 48. In particular, the ohmic contact layers 55 and 56, respectively underlying a source electrode 65 and a drain electrode 66, reduce their contact resistance with the semiconductor layer 44.

A plurality of data wires are formed on the ohmic contact layers 52, 55, 56, and 58. The data wires include a data line 62 extending in a vertical direction and crossing the gate line 22 to define a pixel, the source electrode 65, which is a branch of the data line 62 and extends above the ohmic contact layer 55, a data pad 68 connected to an end of the data line 62 to receive an image signal from, for example, an external source, such as a data driver, and the drain electrode 66 formed on the ohmic contact layer 56 opposite to and separated from the source electrode 65 with respect to the gate electrode 26 or a channel portion of the TFT.

The source electrode 65 overlaps with at least a portion of the semiconductor layer 44. The drain electrode 66 faces the source electrode 65 with respect to the gate electrode 26 and overlaps with at least a portion of the semiconductor layer 44.

The ohmic contact layers 52, 55, 56, and 58 have substantially the same shapes as the data wires 62, 65, 66, and 68. The semiconductor layers 42, 44, and 48, except for the channel portion of the TFT, also have substantially the same shapes as the data wires 62, 65, 66, and 68 and the ohmic contact layers 52, 55, 56, and 58. In other words, the source electrode 65 is separated from the drain electrode 66 at the channel portion of the TFT and the ohmic contact layer 55 underlying the source electrode 65 is separated from the ohmic contact layer 56 underlying the drain electrode 66, but the semiconductor layer 44 for the TFT is continuous to form the channel of the TFT.

The passivation layer 70 is formed on the data wires 62, 65, 66, and 68 and the portion of the semiconductor layer 44 that is not covered with the data wires 62, 65, 66, and 68. The passivation layer 70 comprises, for example, an inorganic insulator such as silicon nitride, or a low dielectric insulating material such as a-Si:C:O and a-Si:O:F formed by plasma enhanced chemical vapor deposition (PECVD). When the passivation layer 70 comprises an organic material, an insulating layer (not shown) comprising silicon nitride ($SiN_x$) or silicon oxide ($SiO_2$) may be additionally formed under the passivation layer 70 to prevent an exposed portion of the semiconductor layer 44 between the source electrode 65 and the drain electrode 66 from contacting the organic material of the passivation layer 70. An organic layer 72 is formed on the passivation layer 70.

The passivation layer 70 and the gate insulating layer 30, located between the storage electrode 27 and the pixel electrode 82, provide storage capacitance for the storage capacitor 90. The organic layer 72 is formed on the passivation layer 70. The organic layer 72 comprises, for example, an organic material having a good flatness characteristic and photosensitivity, such as PFCB (PerFluoroCycloButane), BCB (BenzoCycloButene), or acryl.

Contact holes 76 and 78 are formed in the organic layer 72 to expose the drain electrode 66 and the data pad 68, respectively. A contact hole 74 is formed in the passivation layer 70 and the gate insulating layer 30 to expose the gate pad 24. The contact holes 76, 78, and 74 respectively exposing the drain electrode 66, the data pad 68, and the gate pad 24 may have a step profile. An opening 77 is formed by removing a portion of the organic layer 72 above the storage electrode 27 to expose the passivation layer 70. Meanwhile, pixel electrode 82, and auxiliary gate and data pads 84 and 88, are formed on a portion of the organic layer 72 including the contact holes 74, 76, and 78 and the opening 77. The pixel electrode 82 is connected to the drain electrode 66 through the contact hole 76. The pixel electrode 82 is connected to the passivation layer 70 through the opening 77 and forms an opposite electrode to the storage electrode 27. The storage capacitor 90 is connected to the liquid crystal capacitor (not shown) in parallel through the pixel electrode 82. The auxiliary gate pad 84 and auxiliary data pad 88 are formed on the organic layer 72 to be respectively connected to the gate pad 24 and the data pad 68 through the contact holes 74 and 78. The pixel electrode 82 and the auxiliary gate and data line end portions 84 and 88 comprise, for example, ITO or IZO.

A method of manufacturing a TFT substrate according to an embodiment of the present invention will be described with reference to FIGS. 1A, 1B and 2A through 13.

Figure 2A:
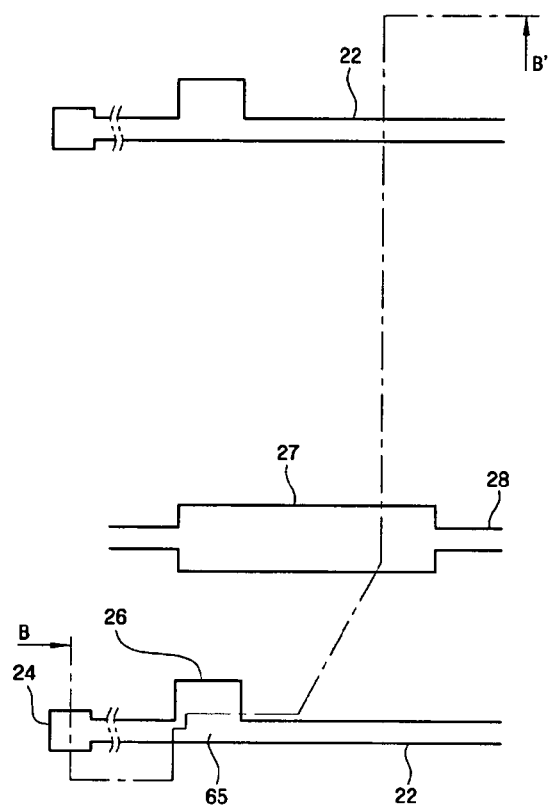
FIGS. 2A, 4A and 10A are layout diagrams showing stages in a method of manufacturing a TFT substrate according to an embodiment of the present invention.
Figure 2B:
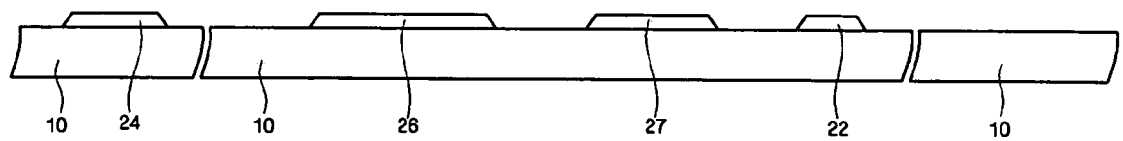
FIGS. 2B and 3 are cross-sectional views showing manufacturing stages according to an embodiment of the present invention, taken along the line B-B' shown in FIG. 2A.

First, referring to FIGS. 2A and 2B, a conductive layer is formed on the insulating substrate 10 and then subjected to photolithography, thereby forming the gate line 22, gate pad 24, gate electrode 26, storage electrode 27, and storage electrode line 28.

More specifically, a single metal layer comprising, for example, chromium (Cr), aluminum (Al), molybdenum (Mo) or molybdenum tungsten (MoW), or a dual- or triple-layer gate metal comprising, for example, an aluminum alloy (AlNd) and a chromium metal or an aluminum alloy (AlNd) and a tungsten metal, is formed using a sputtering method and photoresist is applied thereon. Thereafter, a mask is disposed on the photoresist and then exposure and development is performed. Thereafter, wet etching is performed and the photoresist is lifted to form the gate line 22, gate pad 24, gate electrode 26, storage electrode 27, and storage electrode line 28, as shown in FIGS. 2A and 2B.

Figure 3:
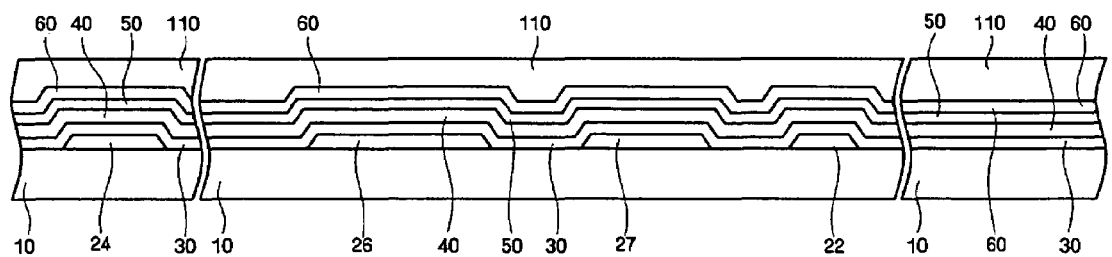

Subsequently, as shown in FIG. 3, the gate insulating layer 30 comprising, for example, silicon nitride, an intrinsic amorphous silicon layer 40, and a doped amorphous silicon layer 50 are sequentially formed using, for example, chemical vapor deposition (CVD) to a thickness of about 1500 through about 5000 Å, a thickness of about 500 through about 2000 Å, and a thickness of about 300 through about 600 Å, respectively.

Next, a conductive layer 60 is formed on the doped amorphous silicon layer 50 using the sputtering method.

Next, a photoresist layer 110 is formed on the conductive layer 60.

Figure 4A:
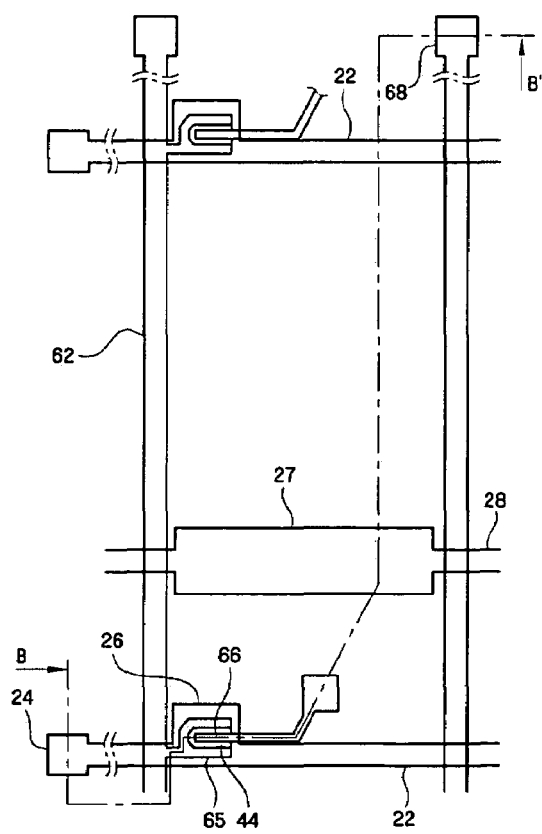
Figure 4B:
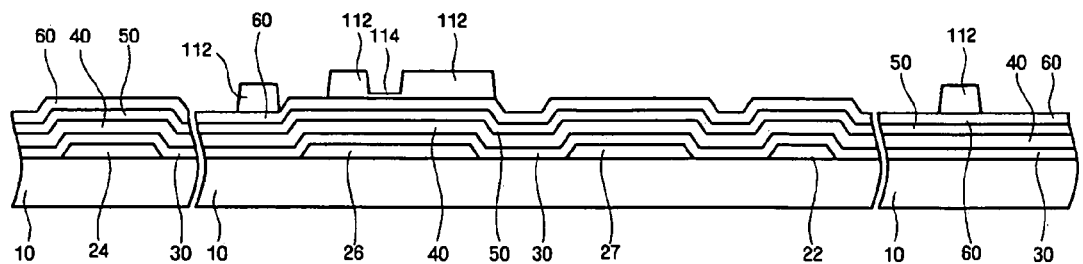

Next, referring to FIGS. 4A and 4B, light is radiated on the photoresist layer 110 through a mask and then development is performed to form a photoresist layer pattern. A first portion 114 of the photoresist layer pattern is positioned where the channel portion of the TFT is to be formed (i.e., between the source electrode 65 and the drain electrode 66), and is thinner than a second portion 112 of the photoresist layer pattern, which is positioned at a data wire portion, where the source and drain electrodes 65, 66, and the data line 62 are to be formed. The entire photoresist layer 110 is removed except for the channel portion and the data wire portion. The photoresist layer 110 that overlaps the storage electrode 27 is also removed. A ratio of the thickness of the first portion 114 of the photoresist layer pattern to the thickness of the second portion 112 of the photoresist layer pattern may be different in accordance with etching conditions. The thickness of the first portion 114 may be smaller than half of the thickness of the second portion 112, for example, it may be smaller than about 4000 Å.

In accordance with alternate embodiments, there may be various methods of forming a photoresist layer with different thicknesses. To adjust the amount of transmitted light, a slit- or grating-shape pattern is formed or a semitransparent layer is used.

When light is radiated on the photoresist layer through such a mask, polymers are completely decomposed at a portion directly exposed to the light, but are not completely decomposed at a portion where the slit pattern or the semitransparent layer is formed since the amount of radiated light is small. Furthermore, little or no polymer decomposition occurs at a portion shielded with, for example, a shade. Next, when the photoresist layer is developed, only the portion where the polymers are not decomposed remains. As a result, a central portion, on which a small amount of light is radiated, is thinner than a portion, on which light is not radiated at all. In accordance with an embodiment, an exposure time is not so long as to decompose all polymers.

Next, the conductive layer 60 is etched. Here, wet etching may be performed using an etchant such as a liquid mixed with, for example, acetic acid, nitric acid, or phosphoric acid.

Figure 5:
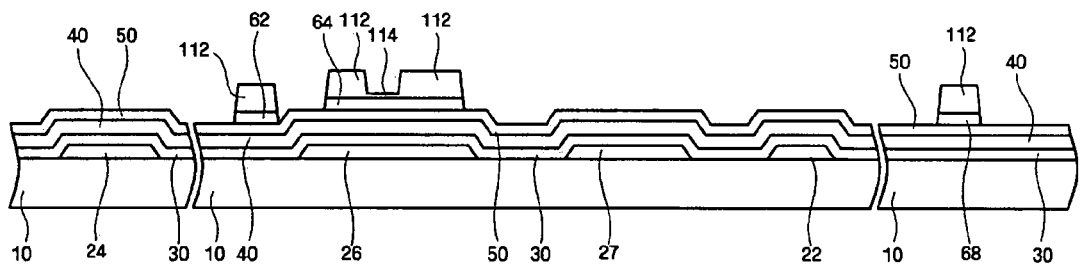

As a result, as shown in FIG. 5, only conductive layer patterns 62, 64, and 68 remain at the channel portion and the data wire portion and all other portions of the conductive layer 60 are removed, thereby exposing the doped amorphous silicon layer 50. The conductive layer patterns 62, 64, and 68 have the same shapes as the data wires 62, 65, 66, and 68 with the exception that the pattern 64 is not separated like the source and drain electrodes 65 and 66.

Figure 6:
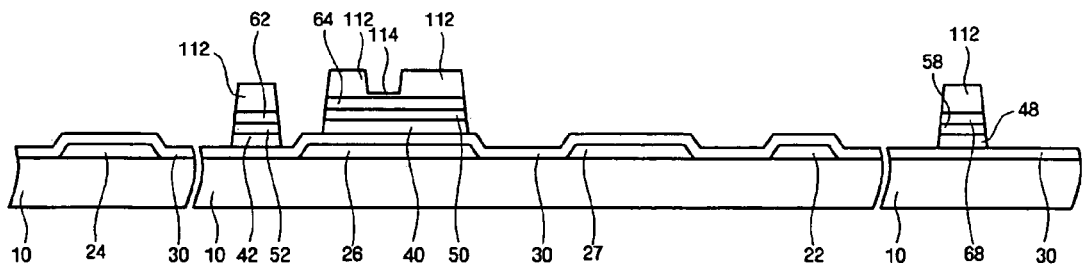

Thereafter, referring to FIG. 6, the doped amorphous silicon layer 50 exposed at portions other than the channel portion and the data wire portion and the intrinsic amorphous silicon layer 40 therebelow are removed simultaneously, together with the first portion 114 of the photoresist layer pattern, using a dry etch. Etching is performed under conditions where the first and second portions 112 and 114 of the photoresist layer pattern, the doped amorphous silicon layer 50, and the intrinsic amorphous silicon layer 40 are simultaneously etched, thereby forming the semiconductor layers 42, 44, and 48 and the ohmic contact layers 50, 52, and 58. The gate insulating layer 30 is not etched during this process.

Figure 7:
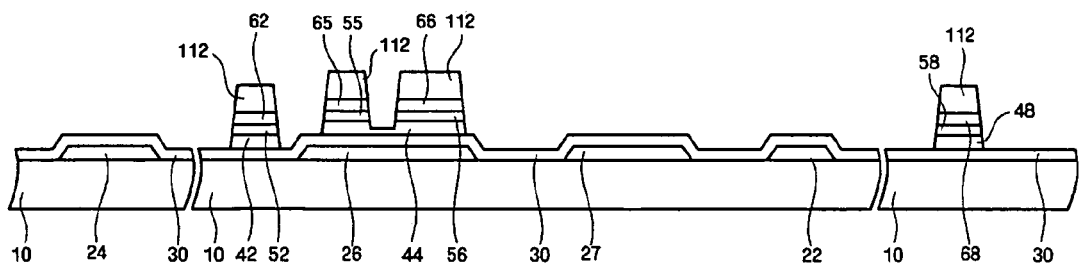

An etch rate of the photoresist layer pattern (112, 114) may be almost the same as that of the intrinsic amorphous silicon layer 40. For example, when a gas mixture of $SF_6$ and HCl or a gas mixture of $SF_6$ and $O_2$ is used, the photoresist layer pattern (112, 114) and the intrinsic amorphous silicon layer 40 can be etched by almost the same thickness. When the etch rate of the photoresist layer pattern (112, 114) is the same as that of the intrinsic amorphous silicon layer 40, the thickness of the first portion 114 is equal to or smaller than the sum of the thickness of the intrinsic amorphous silicon layer 40 and the thickness of the doped amorphous silicon layer 50. Under this condition, as shown in FIG. 7, the first portion 114 at the channel portion is removed, thereby exposing a source/drain pattern 64; and the doped amorphous silicon layer 50 and the intrinsic amorphous silicon layer 40 at other portions are removed, thereby exposing the gate insulating layer 30. Meanwhile, the second portion 112 at the data wire portions is also etched and thus becomes thinner.

Subsequently, a photoresist layer residue remaining on a surface of the source/drain pattern 64 is removed using an ashing process.

Thereafter, referring to FIG. 7, the source/drain pattern 64 at the channel portion is etched and removed. Here, wet etching is performed.

Next, the ohmic contact layers 55 and 56 comprising, for example, doped amorphous silicon are etched. A dry etch may be used. For example, a gas mixture of $CF_4$ and HCl or a gas mixture of $CF_4$ and $O_2$ may be used as an etching gas. When the gas mixture of $CF_4$ and $O_2$ is used, the semiconductor layer 44 made of intrinsic amorphous silicon can be left with a uniform thickness. The semiconductor layer 44 may be partially removed and decreased in thickness and the second portion 112 of the photoresist layer pattern may be etched by a certain thickness. The etching process is performed such that the gate insulating layer 30 is not etched. It is preferable that the photoresist layer pattern is thick enough not to allow the second portion 112 to be etched and not to allow the data wires 62, 65, 66, and 68 under the second portion 112 to be exposed.

The source electrode 65 and the drain electrode 66 are formed to be separated from each other, thereby completing the data wires 65 and 66 and the ohmic contact layers 55 and 56 therebelow.

Figure 8:
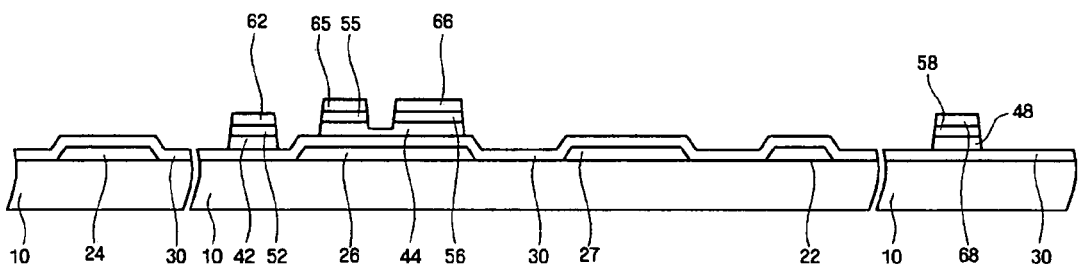

Subsequently, referring to FIG. 8, the second portion 112 of the photoresist layer pattern remaining at the data wire portions is removed.

Figure 9:
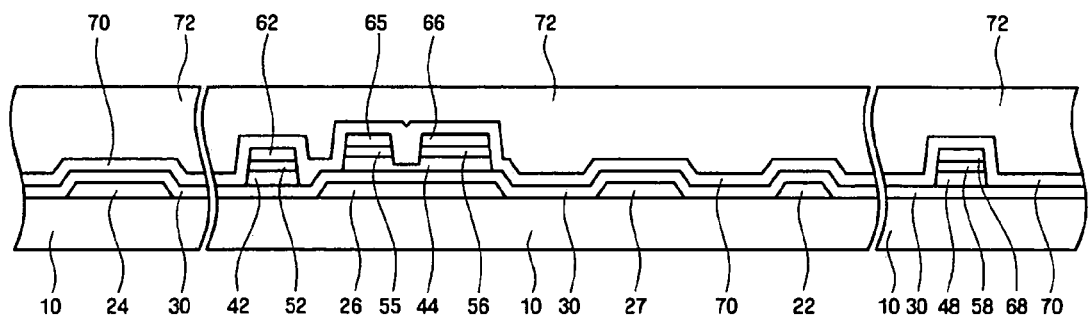

Next, referring to FIG. 9, an insulating material with a low dielectric constant such as, for example, a-Si:C:O or a-Si:O:F formed using, for example, plasma enhanced chemical vapor deposition (PECVD) or an inorganic material such as silicon nitride ($SiN_x$) is deposited to form the passivation layer 70.

Thereafter, PFCB, BCB, or an acrylic material, for example, is deposited on the passivation layer 70 to form the organic layer 72. The passivation layer 70 may have a thickness of about 0.15 through about 0.25 µm and the organic layer 72 may have a thickness of about 2.5 through about 3.5 µm. The organic layer 72 may have a thickness of about 3.0 µm to reduce parasitic capacitance between the drain electrode 66 and the pixel electrode 82 and minimize the reduction of the transmittance of the organic layer 72.

Figure 10A:
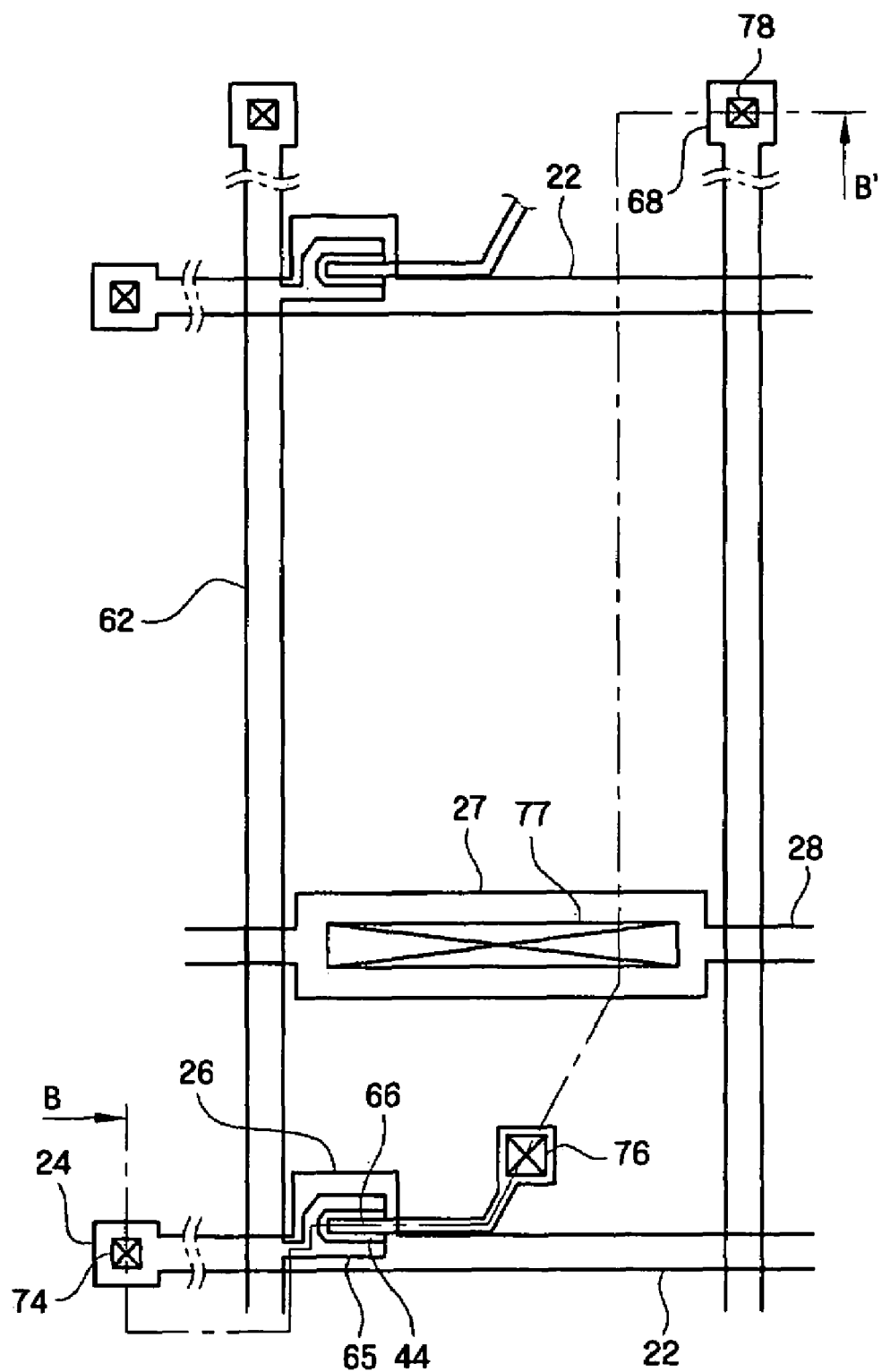
Figure 10B:
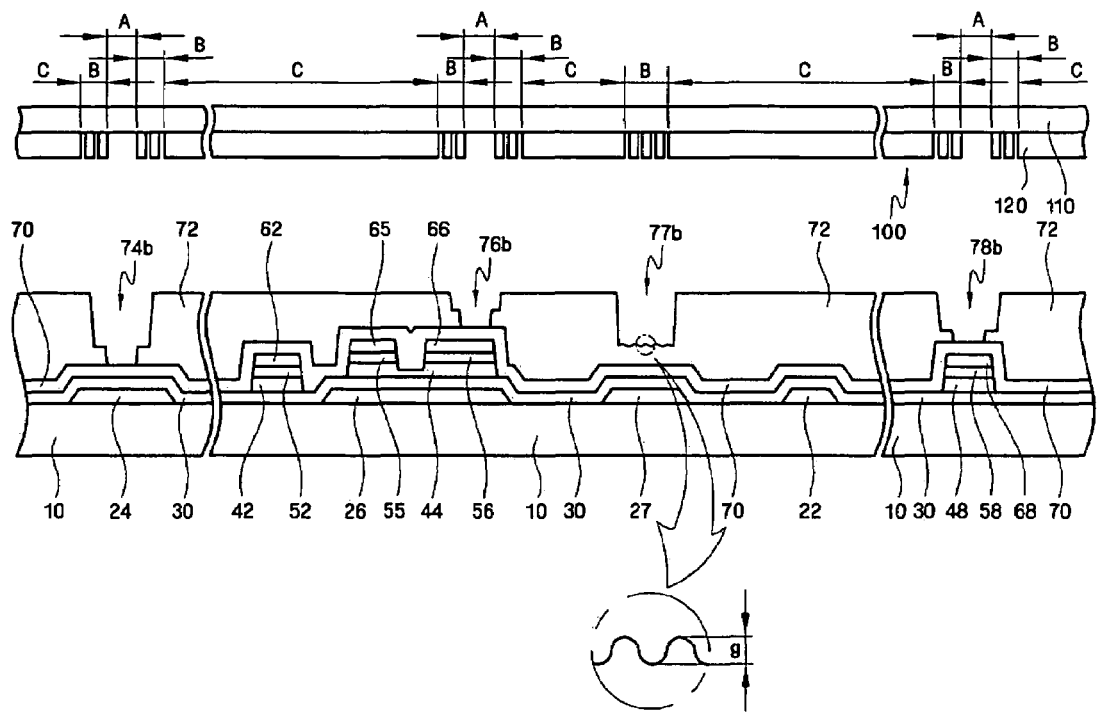
FIG. 10B is a cross-sectional view taken along the line B-B' shown in FIG. 10A, showing a manufacturing stage according to an embodiment of the present invention, in which light exposure is performed using a slit mask to form an organic layer pattern.

Referring to FIGS. 10A and 10B, an optical mask 100 is aligned on the organic layer 72. The optical mask 100 includes a transparent substrate 110 and a shield layer 120 below the transparent substrate 110. The optical mask 100 also includes an opaque region C where the width of the shield layer 120 is at least a predetermined value, a transparent region A having a predetermined width where the shield layer 120 is not present, and a semitransparent region B including portions of the shield layer 120 having a slit shape, where the width of the slit-shaped portions of the shield layer 120 and/or a distance between the slit-shaped portions of the shield layer 120 is less than predetermined value.

The optical mask 100 is aligned such that the transparent region A corresponds to portions of the organic layer 72 that overlap with the gate pad 24, the drain electrode 66, the storage electrode 27, and the data pad 68.

Subsequently, exposure and development is performed on the optical mask 100, thereby forming a concave portion 77b overlapping with the storage electrode 27.

As shown in an enlarged view within the circle in FIG. 10B, the concave portion 77b formed using the semitransparent region B has a rugged pattern having a height difference "g" on the bottom surface of the concave portion 77b. A portion of the organic layer 72 under the concave portion 77b remains on the passivation layer 70. The thickness of the remaining organic layer 72 may be about 0.5 through about 1.5 µm and, in accordance with an embodiment, may be about 1.0 µm to protect the passivation layer 70 and the gate insulating layer 30 that overlap with the storage electrode 27 during a process of etching the passivation layer 70 and/or the gate insulating layer 30 using organic layer patterns 74b, 76b, and 78b. The remaining organic layer 72 protects the passivation layer 70 that overlaps with the storage electrode 27 to form the storage capacitor. The organic layer patterns 74b, 76b, and 78b are formed at portions of the passivation layer 70 that overlap with the gate pad 24, the drain electrode 66, and the data pad 68 such that the passivation layer 70 is exposed. The organic layer patterns 74b, 76b, and 78b may have a step profile.

In an illustrative embodiment of the present invention, the organic layer patterns 74b, 76b, and 78b are formed using a slit mask, but a mask including a grating pattern or a semitransparent layer may be used.

A width of a slit may be smaller than a resolution of an exposure device. When a semitransparent layer is used, a thin film having different transmittances or different thicknesses may be used in manufacturing the mask to adjust a transmittance.

Figure 11:
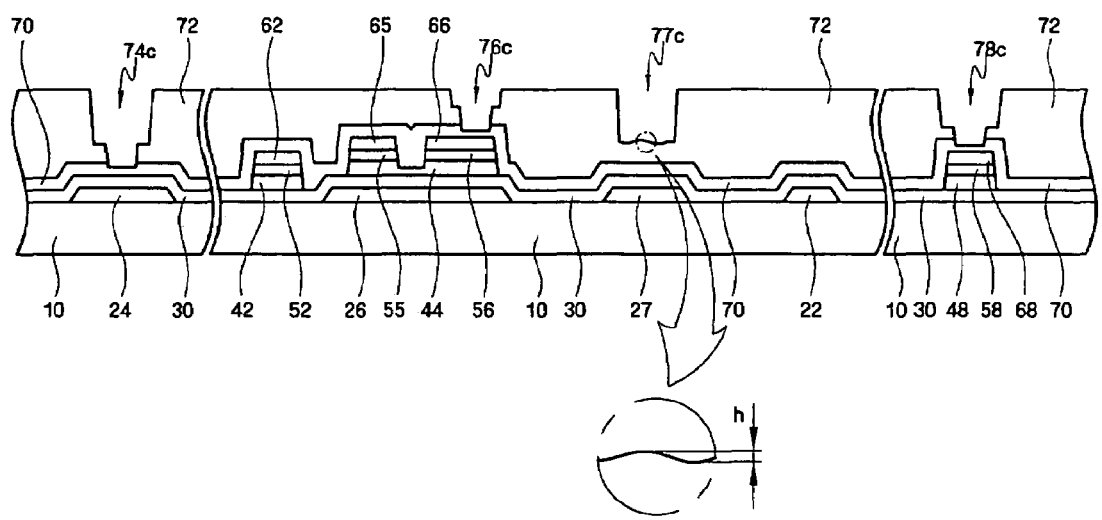
FIG. 11 is a cross-sectional view taken along the line B-B' shown in FIG. 10A, showing a manufacturing stage according to an embodiment of the present invention, in which the organic layer pattern is etched to remove a rugged surface from the bottom of a concave portion.

Referring to FIG. 11, a dry etch is performed on the rugged pattern formed on the bottom of the concave portion (77b shown in FIG. 10B). Here, a protrusion of the rugged pattern is etched more than a recess of the rugged pattern so that the height difference "g" is reduced. The recess is so slightly etched so as not to influence the reduction of the height difference. The protrusion is etched such that the height difference "g" between the protrusion and recess formed on the bottom of the concave portion 77b is reduced to a height difference "h" (where h<g), as shown in an enlarged view circled in FIG. 11. Etching of the protrusion is performed without exposing the passivation layer 70 below the concave portion 77b, thereby forming a concave portion 77c. Here, a gas mixture of, for example, $SF_6$ and $O_2$ or a gas mixture of, for example, $SF_6$ and $N_2$ may be used as a dry etching gas. When the ruggedness is reduced, time taken for planarization using ashing may be reduced.

With this dry etch, the passivation layer 70 under organic layer patterns 74c, 76c, and 78c overlapping with the gate pad 24, the data pad 68, and the drain electrode 66, may be partially or entirely etched through the organic layer patterns 74c, 76c, and 78c.

Figure 12:
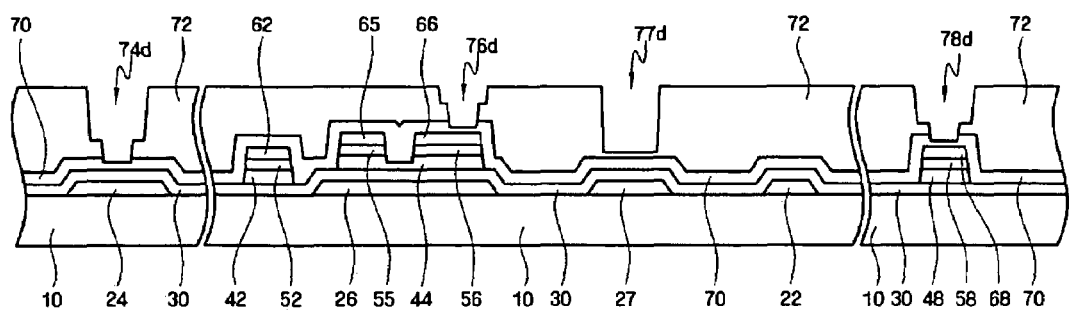
FIG. 12 is a cross-sectional view taken along the line B-B' shown in FIG. 10A, showing a manufacturing stage according to an embodiment of the present invention, in which the bottom of the concave portion is planarized after an ashing process.

Referring to FIG. 12, an ashing process is performed on the rugged bottom of the concave portion (77c in FIG. 11), thereby forming a concave portion 77d with a planarized bottom. In detail, oxygen plasma, for example, is applied at high temperature so that the protrusion and the recess in the concave portion (77c in FIG. 11) made of a polymer organic material reacts with a byproduct of the oxygen plasma, i.e., an oxygen radical (O*). As a result, the organic material is decomposed and $CO_2$ and $H_2O$ are generated. Here, the protrusion in the concave portion (77c in FIG. 11) is decomposed more than the recess in the concave portion, and therefore, the bottom of the concave portion 77d is substantially planarized. To improve the efficiency of the ashing process, a gas mixture of hydrogen ($H_2$) and nitrogen ($N_2$) may be used. Since the ashing using oxygen plasma provides a better selectivity for the organic layer 72 than it provides for the passivation layer 70, there is no appreciable influence on the passivation layer 70 by the ashing process. Here, the ashing is controlled not to expose the passivation layer.

When the concave portion 77d has the planarized surface, the passivation layer 70 and the gate insulating layer 30 that overlap with the storage electrode 27 are prevented from being etched during a subsequent etching process and the storage electrode 27 is prevented from being exposed. In addition, since the organic layer 72 on the passivation layer 70 is planarized, the storage capacitor has constant capacitance regardless of positions along the storage capacitor 90.

Figure 13:
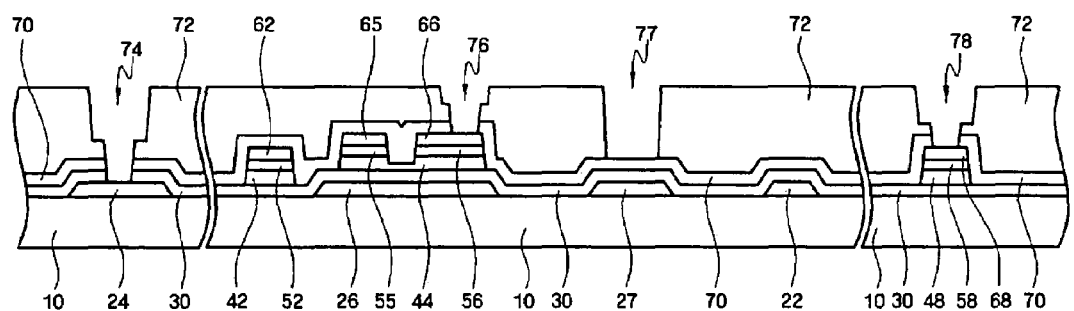
FIG. 13 is a cross-sectional view taken along the line B-B' shown in FIG. 10A, view taken along the line B-B' shown in FIG. 10A, showing a manufacturing stage according to an embodiment of the present invention, in which an opening and a contact hole are formed by performing an etch process on the organic layer pattern.

Referring to FIG. 13, the dry etching gas used in the stage shown in FIG. 11 is used to expand the concave portion (77*d* in FIG. 12), thereby forming the opening 77 exposing the passivation layer 70 overlapping with the storage electrode 27. In addition, the dry etching gas is used to form the contact holes 76 and 78 exposing the data wires (66, 68) and the contact hole 74 exposing the gate pad 24.

In an illustrative embodiment of the present invention, the organic layer 72 is removed from the passivation layer 70 that overlaps with the storage electrode 27, but a thin portion of the organic layer 72 may remain on the passivation layer 70. In addition, to increase capacitance of the storage capacitor by reducing a distance between the storage electrode 27 and the pixel electrode 82, etching may be further progressed until the passivation layer 70 is partially or entirely removed so that a storage capacity of the storage capacitor is formed with respect to a part of the passivation layer 70 and the gate insulating layer 30 or with respect to only the gate insulating layer 30.

Thereafter, as shown in FIGS. 1A and 1B, an indium tin oxide (ITO) layer or an indium zinc oxide (IZO) layer is deposited to a thickness of about 400 through about 500 Å and then is subjected to photolithography, thereby forming the pixel electrode 82 on the passivation layer 70 overlapping with the storage electrode 27 in the opening 77. In addition, the auxiliary gate pad 84 connected with the gate pad 24, the pixel electrode 82 connected with the drain electrode 66, and the auxiliary data pad 88 connected with the data pad 68 are formed in the contact holes 74, 76, and 78, respectively.

When the pixel electrode 82 is formed on the passivation layer 70, the storage capacitor including the storage electrode 27, the gate insulating layer 30, the passivation layer 70, and the pixel electrode 82 is completed. The pixel electrode 82 is an opposite electrode to the storage electrode 27 in the storage capacitor. In addition, the pixel electrode 82 extends to be connected with the drain electrode 66 and is connected with the liquid crystal capacitor (not shown) in parallel.

In an embodiment, nitrogen may be used as a gas in a pre-heating process before an ITO layer is deposited to prevent a metal oxide layer from being formed on a surface of the metal layers 24, 66, and 68 exposed through the contact holes 74, 76, and 78.

In an embodiment of the present invention, a 4-mask process is performed. However, the present invention is not restricted thereto. For example, a TFT substrate may be manufactured using a data wire and a semiconductor layer as a mask.

In addition, the data wire may be a single layer in an embodiment of the present invention. Alternatively, a gate wire or the data wire may be, for example, a dual or triple layer.

The rugged bottom surface of an organic layer overlapping a storage electrode is removed using a slit mask from the surface of the organic layer remaining on a passivation layer so that the passivation layer and a gate insulating layer are not etched during subsequent etching processes performed to form contact holes, thereby preventing a short circuit of a pixel electrode and a storage electrode.

A difference in capacitance between different positions on a storage capacitor is minimized or removed, thereby preventing image flickering in an LCD.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of manufacturing a thin film transistor substrate, the method comprising:
   forming a passivation layer on a substrate having a storage electrode;
   forming an organic layer covering the passivation layer;
   forming a concave portion in the organic layer by partially removing a portion of the organic layer that overlaps the storage electrode;
   planarizing a rugged pattern located on a bottom surface of the concave portion; and
   forming an opening extending to a surface of the passivation layer by removing the planarized organic layer from the concave portion.

2. The method of claim 1, wherein planarizing comprises performing ashing to reduce the rugged pattern.

3. The method of claim 2, wherein ashing is performed using oxygen plasma.

4. The method of claim 3, wherein ashing using the oxygen plasma is performed in an atmosphere including a gas mixture of nitrogen and hydrogen.

5. The method of claim 2, further comprising dry etching the concave portion before ashing, wherein the organic layer remains on the bottom surface of the concave portion after dry etching.

6. The method of claim 2, further comprising etching the rugged pattern to reduce a height difference between a protrusion and a recess of the rugged pattern before ashing.

7. The method of claim 6, wherein etching of the rugged pattern includes dry etching using a gas mixture of $SF_6$ and $O_2$ or a gas mixture of $SF_6$ and $N_2$.

8. The method of claim 1, wherein forming the concave portion comprises performing patterning using a mask including a slit having a size less than a resolution of light used for exposure or a mask including a semitransparent layer.

9. The method of claim 1, wherein forming the opening comprises performing a dry etch using a gas mixture of $SF_6$ and $O_2$ or a gas mixture of $SF_6$ and $N_2$.

10. The method of claim 1, wherein the organic layer covering the passivation layer has a thickness of about 2.5 μm through about 3.5 μm.

11. The method of claim 10, wherein a remaining portion of the organic layer in the concave portion having the rugged pattern has a thickness of about 0.5 μm through about 1.5 μm.

12. The method of claim 1, further comprising forming a pixel electrode in the opening, the pixel electrode covering a portion of the passivation layer that overlaps the storage electrode.

13. A method of manufacturing a thin film transistor substrate, the method comprising:
   forming a gate wire on a substrate, the gate wire comprising a gate line, a gate electrode and a storage electrode;

forming a gate insulating layer covering the gate wire;

forming a semiconductor layer and a data wire comprising a data line, a source electrode, and a drain electrode by sequentially forming an amorphous silicon layer and a data conductive layer on the gate insulating layer;

forming a passivation layer on the data wire;

forming an organic layer covering the passivation layer;

forming a concave portion in the organic layer by partially removing a portion of the organic layer that overlaps the storage electrode;

planarizing a rugged pattern located on a bottom surface of the concave portion; and forming an opening extending to a surface of the passivation layer by removing the planarized organic layer from the concave portion.

14. The method of claim 13, wherein planarizing comprises performing ashing to reduce the rugged pattern.

15. The method of claim 14, wherein ashing is performed using oxygen plasma.

16. The method of claim 15, wherein ashing using the oxygen plasma is performed in an atmosphere including a gas mixture of nitrogen and hydrogen.

17. The method of claim 14, further comprising dry etching the concave portion before ashing, wherein the organic layer remains on the bottom surface of the concave portion after dry etching.

18. The method of claim 14, further comprising etching the rugged pattern to reduce a height difference between a protrusion and a recess of the rugged pattern before ashing.

19. The method of claim 18, wherein etching of the rugged pattern includes dry etching using a gas mixture of $SF_6$ and $O_2$ or a gas mixture of $SF_6$ and $N_2$.

20. The method of claim 13, wherein forming the concave portion comprises performing patterning using a mask including a slit having a size less than a resolution of light used for exposure or a mask including a semitransparent layer.

21. The method of claim 13, wherein forming the opening comprises performing a dry etch using a gas mixture of $SF_6$ and $O_2$ or a gas mixture of $SF_6$ and $N_2$.

22. The method of claim 13, wherein the organic layer covering the passivation layer has a thickness of about 2.5 μm through about 3.5 μm.

23. The method of claim 13, wherein a remaining portion of the organic layer in the concave portion having the rugged pattern has a thickness of about 0.5 μm through about 1.5 μm.

24. The method of claim 13, further comprising forming a pixel electrode in the opening, the pixel electrode covering a portion of the passivation layer that overlaps the storage electrode.

25. The method of claim 13, wherein forming the semiconductor layer and the data wire comprises removing the amorphous silicon layer and the data conductive layer that overlap the storage electrode.

26. The method of claim 13, wherein the passivation layer and the conductive layer are formed by performing an etch process using a single mask.

* * * * *